(12) United States Patent
Lee

(10) Patent No.: US 7,283,421 B2
(45) Date of Patent: Oct. 16, 2007

(54) SEMICONDUCTOR MEMORY DEVICE

(75) Inventor: Chang-Hyuk Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 119 days.

(21) Appl. No.: 11/323,509

(22) Filed: Dec. 29, 2005

(65) Prior Publication Data

US 2006/0245292 A1 Nov. 2, 2006

(30) Foreign Application Priority Data

Apr. 30, 2005 (KR) ............... 10-2005-0036579

(51) Int. Cl.
*G11C 8/00* (2006.01)
(52) U.S. Cl. ...................... 365/233; 365/194
(58) Field of Classification Search ............... 365/233, 365/194, 230.08
See application file for complete search history.

(56) References Cited

U.S. PATENT DOCUMENTS

| | | | |
|---|---|---|---|
| 5,031,787 A | | 7/1991 | Ochs |
| 5,781,500 A | * | 7/1998 | Oh .............................. 365/233 |
| 5,991,229 A | * | 11/1999 | Kim et al. .................. 365/233 |
| 6,185,664 B1 | | 2/2001 | Jeddeloh |
| 6,212,126 B1 | * | 4/2001 | Sakamoto .................... 365/233 |
| 6,546,476 B1 | | 4/2003 | Gillingham |
| 6,768,698 B2 | * | 7/2004 | Kono .......................... 365/233 |
| 6,914,850 B2 | | 7/2005 | Chai |

FOREIGN PATENT DOCUMENTS

| | | |
|---|---|---|
| JP | 2003-337742 | 11/2003 |
| JP | 2004-253123 | 9/2004 |

\* cited by examiner

*Primary Examiner*—Anh Phung
(74) *Attorney, Agent, or Firm*—Blakely Sokoloff Taylor & Zafman

(57) ABSTRACT

The present invention provides a semiconductor memory device for reducing a power consumption. A semiconductor memory device includes a command decoding unit for decoding a plurality of commands; a driving signal generation unit for generating a plurality of driving signals synchronized with Nth clocks of an internal clock from an activation timing of a CAS signal generated by the command decoding unit, wherein N is an even integer number; an address delay unit for receiving an internal address in response to the CAS signal and for delaying the internal address signal by synchronizing the internal address with the plurality of driving signals; and a data access block for performing a data access in response to the delayed internal address.

11 Claims, 13 Drawing Sheets

SEMICONDUCTOR MEMORY DEVICE

FIELD OF THE INVENTION

The present invention relates to a semiconductor memory device; and, more particularly, to a semiconductor memory device for reducing power consumption.

DESCRIPTION OF RELATED ART

Generally, for accessing a particular cell included in a semiconductor memory device, a process of selecting a word line and a bit line coupled to the particular cell is required. In order to select the word line and the bit line, corresponding command and address should be inputted. Herein, for performing a corresponding operation in response to the inputted command and the address, an operation margin having a predetermined time is required.

That is, after a row active command and a row address for activating a word line are inputted, a column address for selecting a bit line can be inputted with a read command or a write command after a RAS to CAS delay (tRCD) is passed from the input timing of the row active command the row address.

Meanwhile, in case of a double data rate II synchronous dynamic random access memory (DDR II SDRAM), a user can adjust an input timing of a read command and a write command by setting an additive latency included in an extended mode register set (EMRS). That is, after the input timing of the row active command, the write command or the read command can be inputted even before the tRCD whose value is determined at a design time is passed from the input timing of the row active command by setting the additive latency.

For instance, in case that the tRCD is 3 clocks, the read command and the write command can be inputted one clock after the input timing of the row active command if the additive latency is set as 2 clocks. If the additive latency is set as a 0 clock, the read command and the write command can be inputted 3 clocks, i.e., the tRCD, after the input timing of the row active command.

Herein, in case of the DDR II SDRAM, since the inputted read command and the write command cannot be directly used for performing a corresponding operation and, thus, are regenerated as internal signals for actually triggering the performance of the corresponding operation, the input timing of the commands can be controlled by the user as above-mentioned. That is, the read command and the write command are internally regenerated as a read CAS signal and a write CAS signal respectively.

The read CAS signal is internally activated after a corresponding delay time of the additive latency (AL) is passed from the input timing of the read command. The write CAS signal is internally activated after a corresponding delay time of a write latency (WL=AL+CL (CAS latency)+1) is passed from the input timing of the write command.

Meanwhile, a column address inputted with the read command or the write command has the above-mentioned same delay times. The process of generating an internal column address having the above-mentioned delay time is described below referring to accompanying drawings.

FIG. 1 is a block diagram showing a column address shifting device included in a conventional semiconductor memory device.

As shown, the conventional semiconductor memory device includes a plurality of address shifting units 10 to 16 so that an internal address BUF_OUT<0:3> is outputted as an internal column address AT_COL<0:3> in synchronization with a read CAS signal CASP6_RD or a write CAS signal CASP6_WT having a corresponding delay time of the additive latency or the CAS latency. The number of the plurality of address shifting unit 10 to 16 corresponds to the bit numbers of the address.

Herein, although not shown in FIG. 1, the internal address BUF_OUT is generated by an address buffer. The address buffer adjusts a voltage level of an external address to that of an internal address and, then, synchronizes the adjusted address with an internal clock to thereby generate the internal address BUF_OUT.

FIG. 2 is a schematic circuit diagram depicting the address shifting unit shown in FIG. 1.

As shown, the address shifting unit includes a read address generation unit 20, a write period clock supplying unit 50, a write address generation unit 30 and an output unit 40.

The read address generation unit 20 delays the internal address BUF_OUT for a corresponding delay time of the additive latency to generate an AL address RA_OUT and, then, synchronizes the AL address RA_OUT with the read CAS signal CASP6_RD to generate a read address, wherein the address generation unit 20 receives the internal address BUF_OUT in response to a CAS signal CASP6. The write period clock supplying unit 50 supplies a write period clock CLK in response to an internal write signal WTP6 and maintains the supply of the write period clock CLK until an internal read signal RDP6 is newly inputted.

The write address generation unit 30 delays the AL address RA_OUT for a corresponding delay time of the CAS latency in response to the write period clock CLK and, then, synchronizes the delayed signal with the write CAS signal CASP6_wt to thereby generate a write address. The output unit 40 latches the read address or the write address in order to output the internal column address AT_COL.

The write period clock supplying unit 50 includes a write period detection unit 52 for receiving the internal write signal WTP6 and the internal read signal RDP6 in order to generate a write period signal WT_ADDEN; and a clock output unit 54 for outputting an internal clock CLKP4 as the write period clock CLK only when the write period signal WT_ADDEN is activated.

The clock output unit 54 includes a NAND gate ND1 for receiving the write period signal WT_ADDEN and the internal clock CLKP4; and an inverter I1 for inverting an output of the NAND gate ND1 to thereby generate the write period clock CLK.

The read address generation unit 20 includes a first transfer gate TG1 for transferring the internal address BUF_OUT in response to the CAS signal CASP6; a latch unit 22 for latching and outputting an output of the first transfer gate TG1; a first delay unit 24 for delaying an output of the latch unit 22 in order to generate a first and a second pre AL addresses AL1_ADD and AL2_ADD; an AL selection unit 26 for selecting one of the internal address BUF_OUT, the first pre AL address AL1_ADD and the second pre AL address AL2_ADD according to an AL information signal AL<0:2> in order to output the selected signal as the AL address RA_OUT; and a second transfer gate TG2 for outputting the AL address RA_OUT as the read address in response to the read CAS signal CASP6_RD.

The first delay unit 24 includes a first and a second flip-flops 24a and 24b connected in series for synchronizing the output of the latch unit 22 with the internal clock CLKP4. That is, the first flip-flop 24a generates the first pre AL address AL1_ADD by synchronizing the output of the latch unit 22 with the internal clock CLKP4 and the second flip-flop 24b generates the second pre AL address AL2_ADD by synchronizing the first pre AL address AL2_ADD with the internal clock CLKP4. Herein, the first pre AL address AL1_ADD is delayed for one clock to be outputted as the second pre AL address AL2_ADD.

The write address generation unit 30 includes a second delay unit 32 for outputting the AL address RA_OUT as a first and a second pre CL addresses CL3_ADD and CL4_ADD having a corresponding delay time of the CAS latency in response to the write period clock CLK; a CL selection unit 34 for selection one of the first and the second pre CL addresses CL3_ADD and CL4_ADD according to a CL information signal CL<3:4> in order to output the selected signal as a CL address WA_OUT; and a third transfer gate TG3 for outputting the CL address WA_OUT as the write address in response to the write CAS signal CASP6_WT.

The second delay unit 32 includes a third to a seventh flip-flops 32a to 32e for synchronizing the AL address RA_OUT with the write period clock CLK. Therefore, the sixth flip-flop 32d delays the AL address RA_OUT for 3 clocks to thereby generate the first pre CL address CL3_ADD and the seventh flip-flop 32e delays the first pre CL address CL3_ADD for one clock to thereby generate the second pre CL address CL4_ADD.

Meanwhile, the CAS signal CASP6 is internally generated when a read command (RD) or a write command (WT) for performing operations related to a column of the conventional semiconductor memory device is inputted. The read CAS signal CASP6_RD is generated by delaying the CAS signal CASP6 for a corresponding delay time of the additive latency and the write CAS signal CASP6_WT is generated by delaying the CAS signal CASP6 for a corresponding delay time of the write latency. The AL information signal AL<0:2> has an information of an additive latency included in the EMRS and the CL information signal CL<3:4> has an information of CAS latency+1.

FIG. 3 is a schematic circuit diagram showing the write period detection unit 52 shown in FIG. 2.

As shown, the write period detection unit 52 includes a first p-type metal oxide semiconductor (PMOS) transistor PM1, an n-type metal oxide semiconductor (NMOS) transistor NM1; a second PMOS transistor PM2; and a latch 52a.

A source of the first PMOS transistor PM1 is connected to a power supply voltage VDD and a gate of the first PMOS transistor PM1 receives the internal read signal RDP6. A drain and a source of the NMOS transistor NM1 are respectively coupled to a drain of the first PMOS transistor PM1 and a ground voltage VSS, and a gate of the NMOS transistor NM1 receives the internal write signal WTP6.

The second PMOS transistor PM2 is connected between the power supply voltage VDD and the drain of the first PMOS transistor PM1 and a gate of the second PMOS transistor PM2 receives a power-up signal PWRUP. The latch 52a latches a signal outputted from the drain of the first PMOS transistor PM1 to thereby output the latched signal as the write period signal WT_ADDEN.

The write period detection unit 52 activates the write period signal WT_ADDEN as a logic high level in response to the internal write signal WTP6 and inactivates the write period signal WT_ADDEN as a logic low level in response to the internal read signal RDP6. That is, the write period signal WT_ADDEN is activated when the internal write signal WTP6 is activated and the activation of the WT_ADDEN is kept until the internal read signal RDP6 is inputted.

Further, the write period detection unit 52 initializes the write period signal WT_ADDEN as a logic low level in response to a logic low level, i.e., an inactivation, of the power-up signal PWRUP when the conventional semiconductor memory device is initially operated and a voltage level of an internal voltage is not stable.

An operation of the conventional semiconductor memory device shown in FIGS. 2 and 3 for generating an externally inputted address as the internal column address AT_COL having a corresponding delay time of the additive latency or the CAS latency is describe below.

FIG. 4 is a timing diagram showing an operation of generating the internal column address AT_COL when the conventional semiconductor memory device performs the read command. Herein, it is assumed that the additive latency is 2.

Firstly, an external address is inputted with the read command RD. Therefore, the CAS signal CASP6 is activated by the read command RD and the internal address BUF_OUT has a valid address information.

The read address generation unit 20 receives the internal address BUF_OUT through the first transfer gate TG1 activated in response to an activation of the CAS signal CASP6.

Thereafter, an output of the first transfer gate TG1 is latched by the latch unit 22 and, then, is synchronized with a first clock of the internal clock CLKP4 after the input timing of the read command RD by the first flip-flop 24a to be outputted as the first pre AL address AL1_ADD and is synchronized with a second clock of the internal clock CLKP4 by the second flip-flop 24b to be outputted as the second pre AL address AL2_ADD.

Thereafter, since the second pre AL address AL2_ADD has 2 clocks of the additive latency, the AL selection unit 26 selects the second pre AL address AL2_ADD according to the AL information signal AL<0:2> and outputs the selected signal as the AL address RA_OUT. Then, the AL address RA_OUT is outputted as the read address by the read CAS signal CASP6_RD. The output unit 40 latches the read address and outputs the latched read address as the internal column address AT_COL.

As shown in FIG. 4, the external address inputted with the read command is outputted as the internal column address AT_COL at the timing 'a' which satisfying the 2 clocks of the additive latency. The internal column address $AT_{13}$ COL is maintained until the read command or the write command is newly inputted.

FIG. 5 is a timing diagram showing an operation of generating the internal column address AT_COL when the conventional semiconductor memory device performs the write command. Herein, it is assumed that the additive latency is 2 and the CAS latency is 3.

Firstly, an external address is inputted with the write command WT. Therefore, the CAS signal CASP6 is activated by the write command WT and the internal address BUF_OUT has a valid address information.

The read address generation unit 20 receives the internal address BUF_OUT in response to an activation of the CAS signal CASP6 and outputs the received signal as the AL address RA_OUT having a corresponding delay time of 2 clocks of the additive latency.

Thereafter, the third to the seventh flip-flops 32a to 32e synchronize the AL address RA_OUT with a third clock of the write period clock CLK after receiving the AL address RA_OUT to output the first pre CL address CL3_ADD and synchronize the AL address RA_OUT with a fourth clock of the write period clock CLK to output the second pre CL address CL4_ADD. Since the second pre CL address CL4_ADD has 4 clocks corresponding to CAS latency+1, the CL selection unit 34 selects the second pre CL address CL4_ADD according to the CL information signal CL<3:4> and outputs the selected signal.

Then, the output of the CL selection unit 34 is outputted as the write address through the third transfer gate TG3 activated by the write CAS signal CASP6_WT.

Herein, the write period clock CLK is generated by the write period clock supplying unit 50 in response to the internal write signal WTP6 which is activated when the write command is inputted. The generation of the write period clock CLK is maintained until the internal read command RDP6 is activated in response to a new input of the read command RD.

Finally, the write address is latched by the output unit 40 and, then, is outputted as the internal column address AT_COL.

Meanwhile, according to the conventional semiconductor memory device, due to the generation process of the internal column address, a power is unnecessarily consumed at an idle state and an active state of a bank. The unnecessary power consumed is caused by the plurality of flip-flops included in the read address generation unit for delaying the external address for a corresponding delay time of the additive latency and by the plurality of flip-flops included in the write address generation unit for delaying the AL address for a corresponding delay time of the CAS latency.

That is, the plurality of flip-flops included in the read address generation unit are continuously operated by the internal clock regardless of an input of a valid address and the plurality of flip-flops included in the write address generation unit are continuously operated in response to the input of the write command until the read command is newly inputted.

For instance, in case of a semiconductor memory device whose operational frequency is 400 Mhz, a current consumption of the plurality of flip-flops included in the read address generation unit and the write address generation unit for generating a one-bit column address is about 400 µA at the idle state and the active state of the bank. Generally, since the semiconductor memory device receives a 16-bit address, about 6.4 mA is unnecessarily consumed at the idle state and the active state of the bank.

SUMMARY OF THE INVENTION

It is, therefore, an object of the present invention to provide a semiconductor memory device for reducing a power consumption for generating an address used for performing a read operation or a write operation.

In accordance with an aspect of the present invention, there is provided a semiconductor memory device, including a command decoding unit for decoding a plurality of commands; a driving signal generation unit for generating a plurality of driving signals synchronized with Nth clocks of an internal clock from an activation timing of a CAS signal generated by the command decoding unit, wherein N is an even integer number; an address delay unit for receiving an internal address in response to the CAS signal and for delaying the internal address signal by synchronizing the internal address with the plurality of driving signals; and a data access block for performing a data access in response to the delayed internal address.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
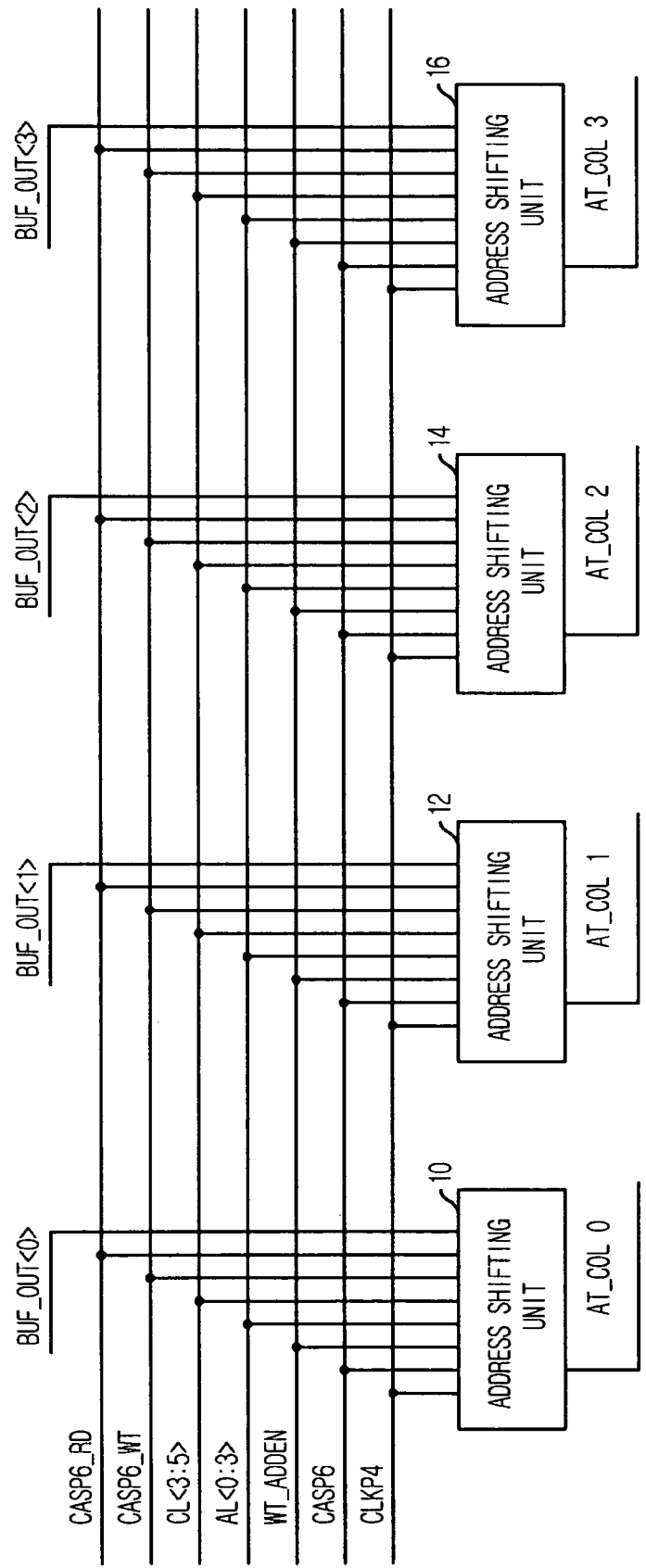
FIG. 1 is a block diagram showing a column address shifting device included in a conventional semiconductor memory device.
Figure 2:
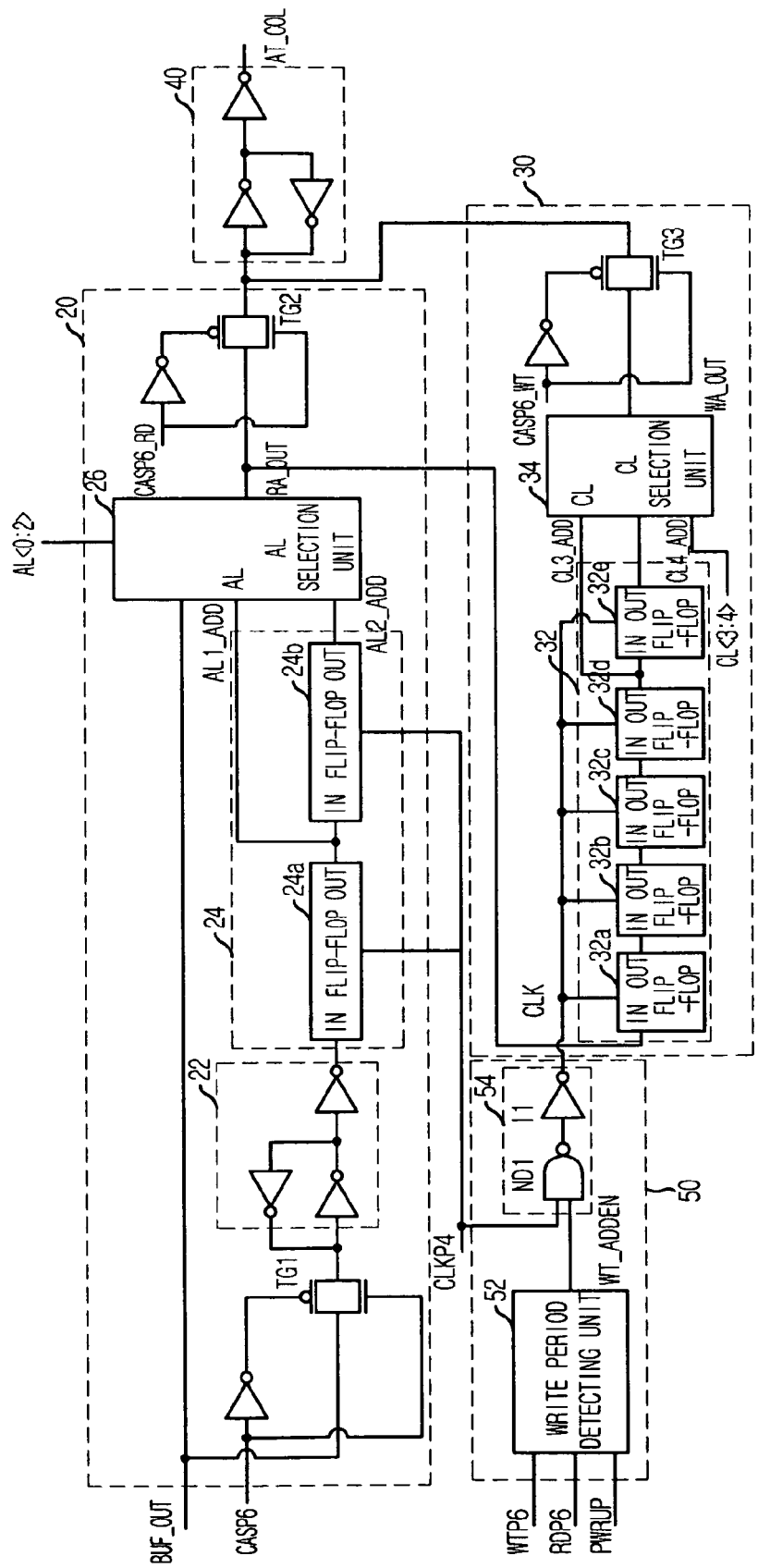
FIG. 2 is a schematic circuit diagram depicting the address shifting unit shown in FIG. 1.
Figure 3:
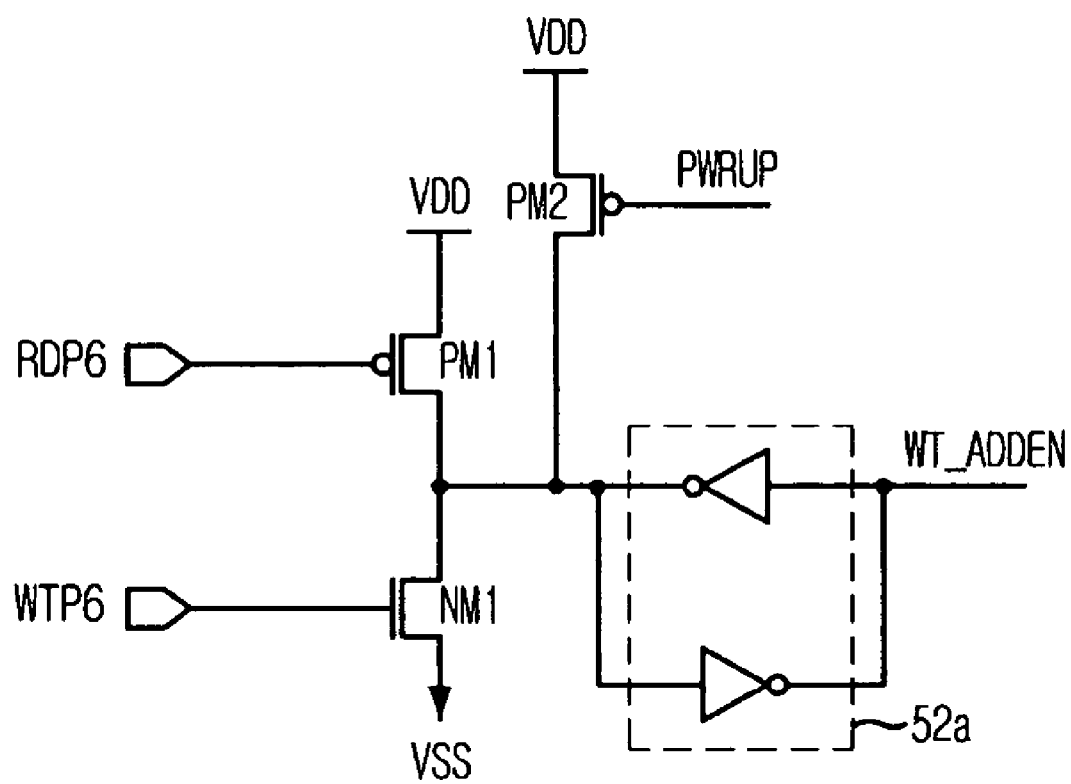
FIG. 3 is a schematic circuit diagram showing the write period detection unit shown in FIG. 2.
Figure 4:
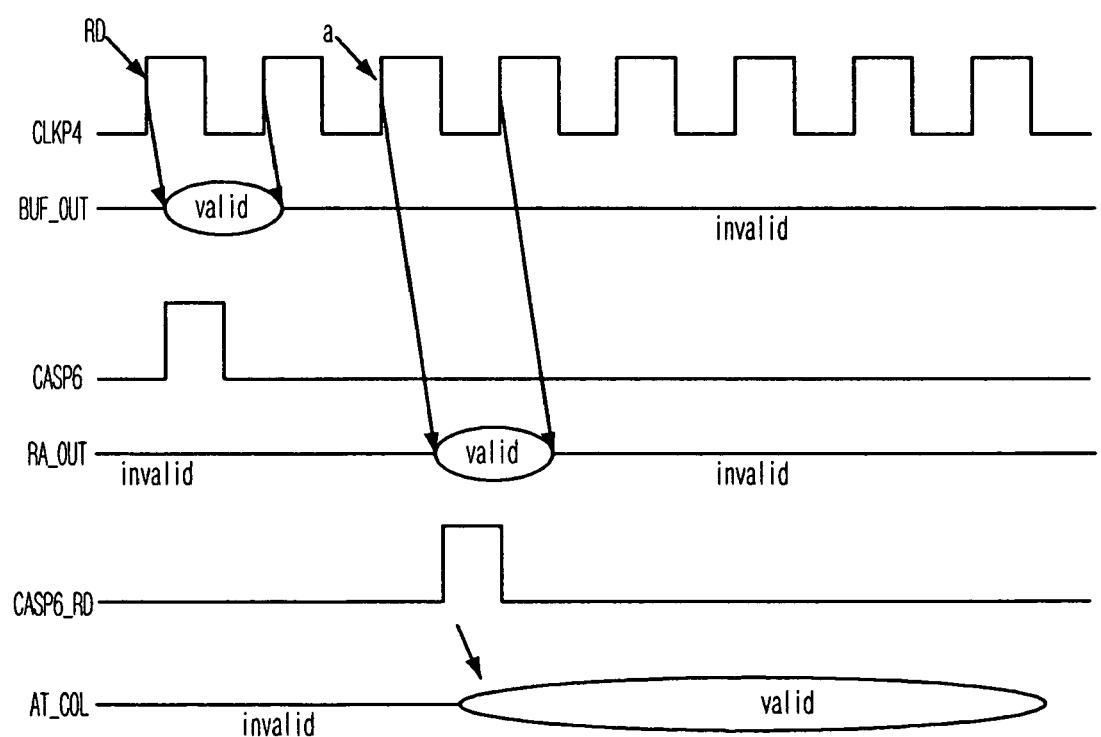
FIG. 4 is a timing diagram showing an operation of generating the internal column address when the conventional semiconductor memory device performs the read command.
Figure 5:
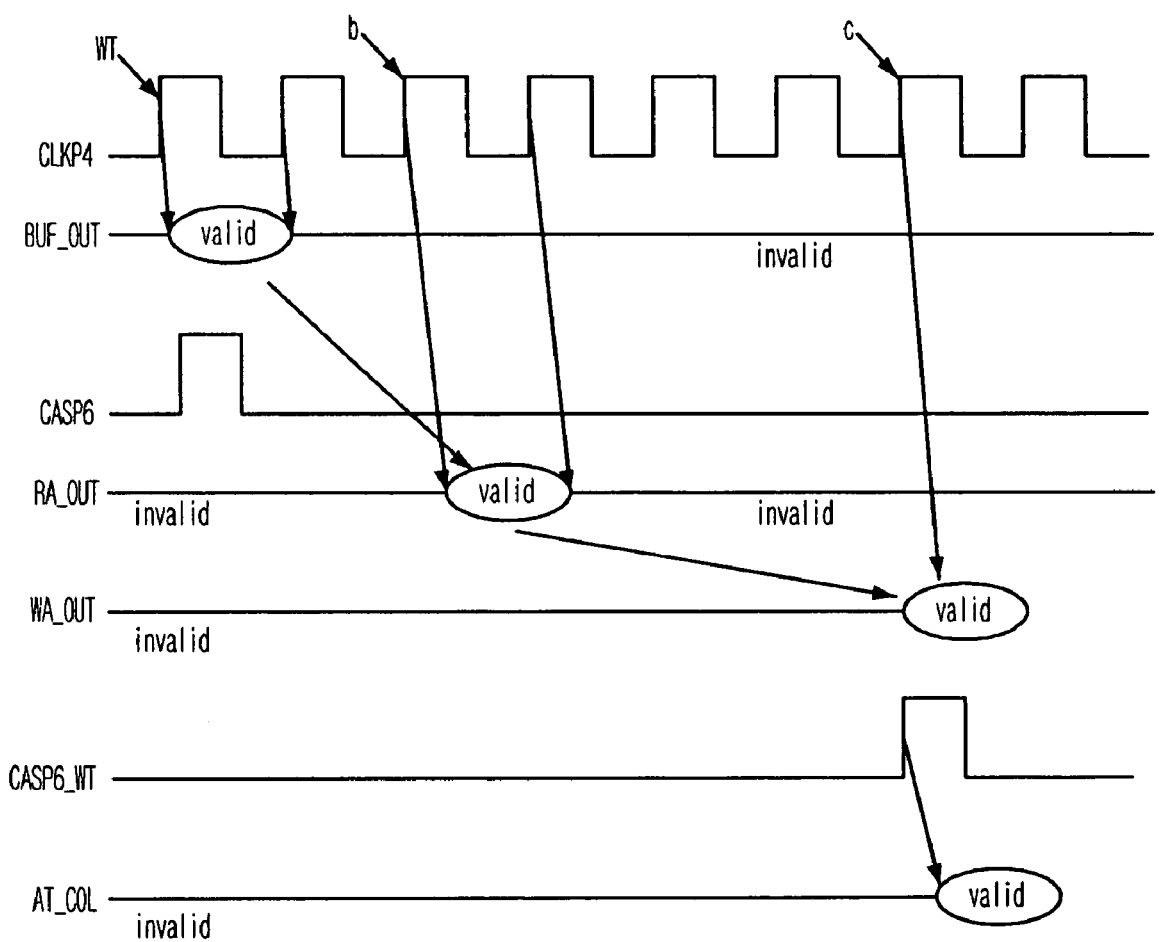
FIG. 5 is a timing diagram showing an operation of generating the internal column address when the conventional semiconductor memory device performs the write command.
Figure 6:
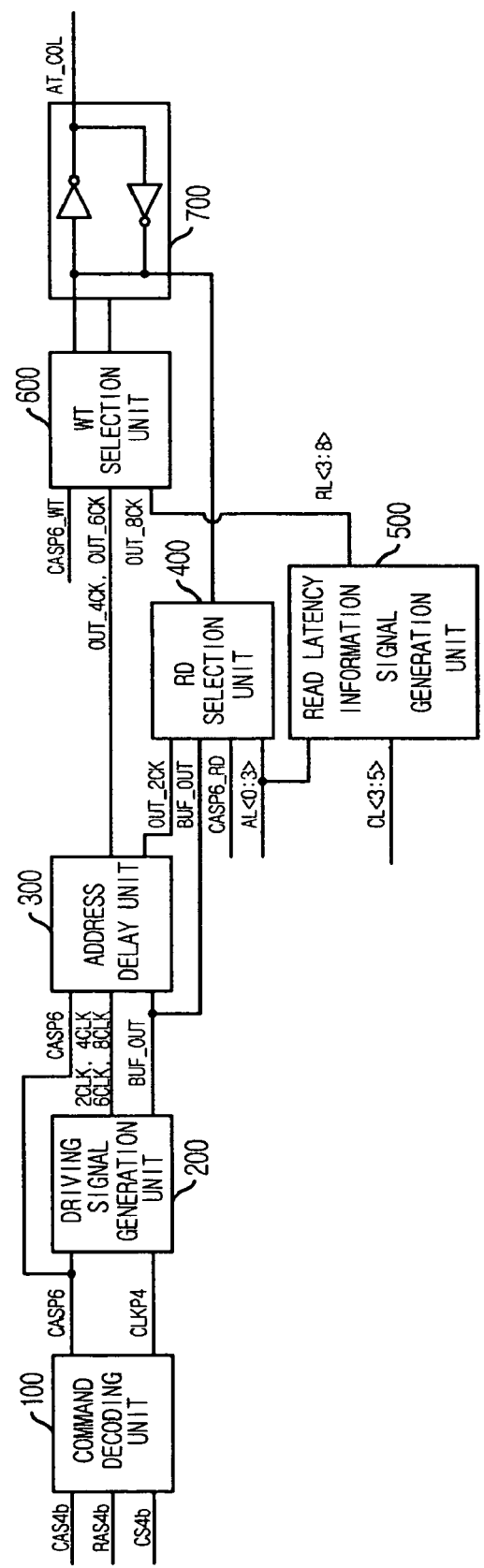
FIG. 6 is a block diagram showing a semiconductor memory device in accordance with a preferred embodiment of the present invention.

FIG. 6 is a block diagram showing a semiconductor memory device in accordance with a preferred embodiment of the present invention.

As shown, the semiconductor memory device includes a command decoding unit 100, a driving signal generation unit 200, an address delay unit 300, an RD selection unit 400, a read latency information signal generation unit 500, a WT selection unit 600 and a latch unit 700.

The command decoding unit 100 decodes a plurality of commands. The driving signal generation unit 200 generates a plurality of driving signals 2CLK, 4CLK, 6CLK and 8CLK synchronized with Nth clocks of an internal clock CLKP4 from an activation timing of a CAS signal CASP6, wherein N is an even number and the CAS signal CASP6 is generated by the command decoding unit. The address delay unit 300 receives an internal address BUF_OUT in response to the CAS signal CASP6 in order to delay and output the internal address BUF_OUT in synchronization with the plurality of driving signals.

The RD selection unit 400 selects one of the internal address BUF_OUT and a first delayed address OUT_2CK generated by the address delay unit 300 in response to an additive latency (AL) information signal AL<0:3> and a read CAS signal CASP6_RD and outputs the selected signal as an internal read address. The read latency information signal generation unit 500 receives the AL information signal AL<0:3> and a CAS latency (CL) information signal CL<3:5> to generate a read latency information signal RL<3:8>.

The WT selection unit 600 selects one of the delayed addresses generated by the address delay unit 300 in response to the read latency information signal RL<3:8> and a write CAS signal CASP6_WT and outputs the selected signal as an internal write address. The latch unit 700 latches the internal read address or the internal write address to output the latched address as an internal column address AT_COL.

That is, since only one of the RD selection unit 400 and the WT selection unit 600 outputs the internal read address or the internal write address at a particular timing, each output node of the RD selection unit 400 and the WT selection unit 600 is commonly coupled to an input node of the latch unit 700.

As above-mentioned, the semiconductor memory device generates the plurality of driving signals, i.e., a first to a fourth driving signals 2CLK to 8CLK, synchronized with Nth clocks of the internal clock CLKP4 from an activation timing of the CAS signal CASP6 which is internally generated when a read command or a write command is inputted. Therefore, only while a valid address is inputted to the semiconductor memory device, related blocks for generating the internal column address AT_COL are operated and, thus, a power consumption can be reduced. Particularly, since the number of activation times of the first to the fourth driving signals 2CLK to 8CLK is half of that of the internal clock CLKP4, a power consumption can be reduced in comparison with the prior art where the internal clock CLKP4 is used instead of the plurality of driving signals.

Figure 7:
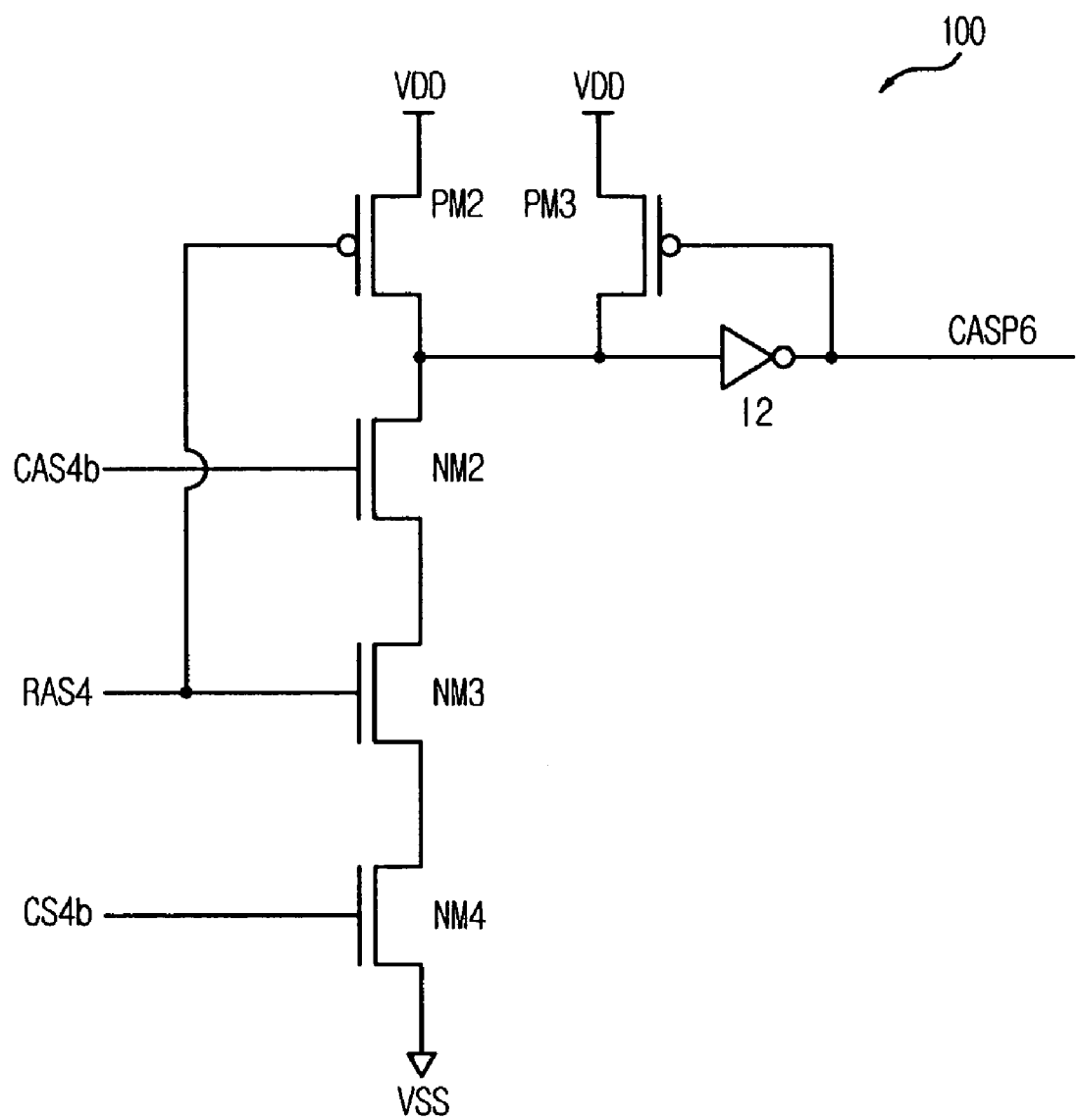
FIG. 7 is a schematic circuit diagram depicting the command decoding unit shown in FIG. 6.

FIG. 7 is a schematic circuit diagram depicting the command decoding unit 100 shown in FIG. 6.

As shown, the command decoding unit 100 includes a first and a second p-type metal oxide semiconductor (PMOS) transistors PM2 and PM3, a first to a third n-type metal oxide semiconductor (NMOS) transistors NM2 to NM4 and a first inverter I2.

A gate of the first PMOS transistor PM2 receives an internal RAS command RAS4 and a source of the first PMOS transistor PM2 is coupled to a power supply voltage VDD. A gate of the first NMOS transistor NM2 receives an internal CAS command CAS4b and a drain of the first NMOS transistor NM2 is coupled to a drain of the first PMOS transistor PM2. A gate of the second NMOS transistor NM3 receives the internal RAS command RAS4 and a drain of the second NMOS transistor NM3 is coupled to a source of the first NMOS transistor NM2.

The third NMOS transistor NM3 is connected between a source of the second NMOS transistor NM2 and a ground voltage VSS and a gate of the third NMOS transistor NM4 receives an internal chip selection command CS4b. The first inverter I2 inverts a voltage loaded on the commonly coupled node between the first PMOS transistor PM2 and the first NMOS transistor NM2 to generate the CAS signal CASP6. The second PMOS transistor PM3 is connected between the power supply voltage and the drain of the first PMOS transistor PM2 and a gate of the second PMOS transistor PM3 receives the internal CAS command CAS4b.

Meanwhile, the internal chip selection command CS4b, the internal RAS command RAS4 and the internal CAS command CAS4b are generated by a command input unit (not shown). That is, the command input unit adjusts a voltage level of an externally inputted signal to an internal voltage level and, then, synchronizes the adjusted inputted signal with the internal clock CLKP4 to thereby generate the internal chip selection command CS4b, the internal RAS command RAS4 and the internal CAS command CAS4b.

Herein, the internal chip selection command CS4b is activated as a logic high level when an externally inputted chip selection command is in a logic low level. The internal RAS command RAS4 is activated as a logic high level when an externally inputted RAS command is in a logic high level. The internal CAS command CAS4b is activated as a logic high level when an externally inputted CAS command is in a logic low level.

Briefly describing an operation of the command decoding unit 100, the command decoding unit 100 activates the CAS signal CASP6 in response to the internal chip selection command CS4b, the internal RAS command RAS4 and the internal CAS command CAS4b which are activated as a logic high level when a read operation or a write operation is requested.

Figure 8:
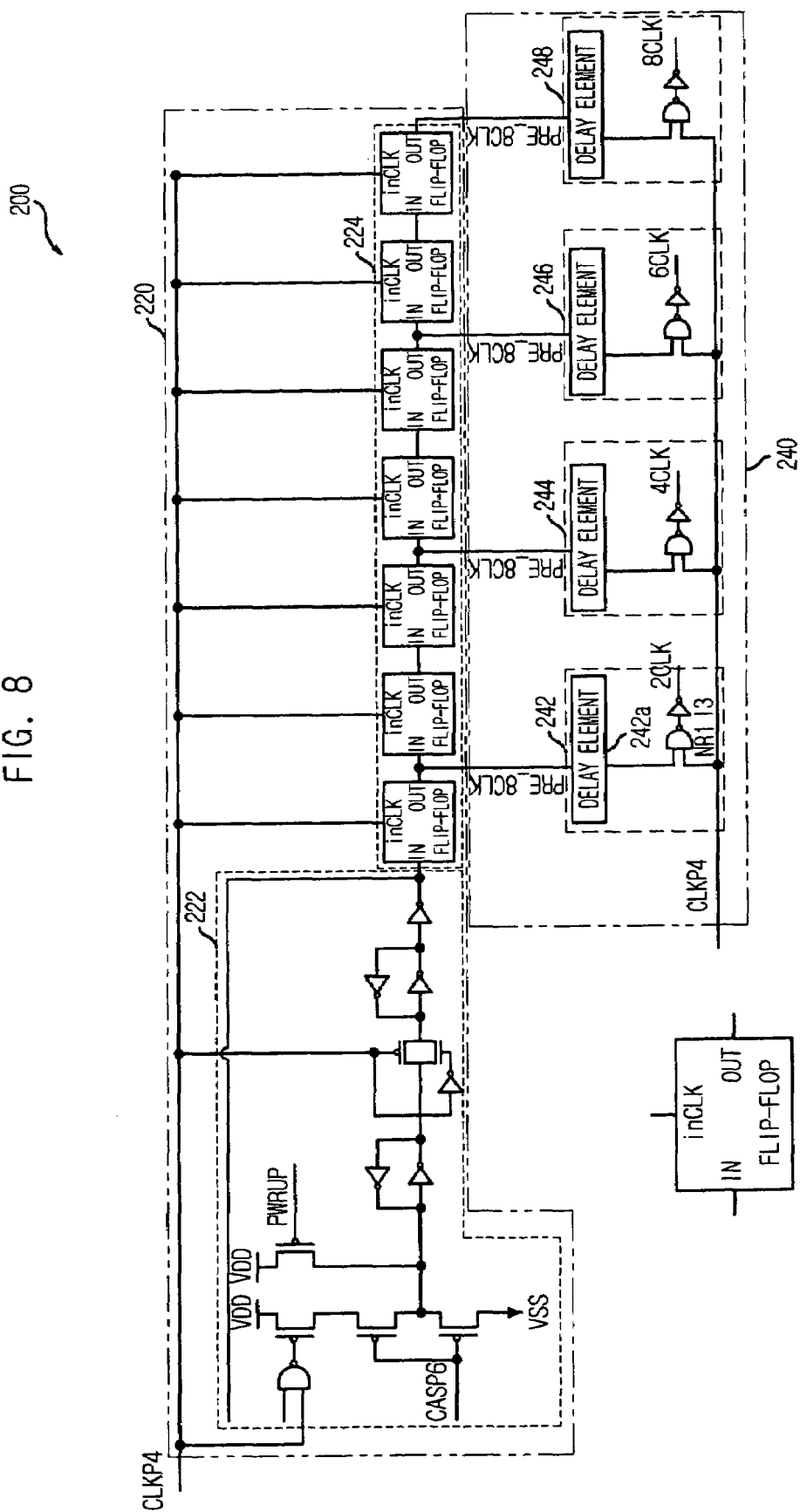
FIG. 8 is a schematic circuit diagram showing the driving signal generation unit shown in FIG. 6.

FIG. 8 is a schematic circuit diagram showing the driving signal generation unit 200 shown in FIG. 6.

As shown, the driving signal generation unit 200 includes a delay unit 220 and an output unit 240.

The delay unit 220 synchronizes the CAS signal CASP6 with Nth clocks of the internal clock CLKP4 from an activation timing of the CAS signal CASP6 to thereby generate a first to a fourth pre driving signals PRE_2CLK to PRE_8CLK, where N is an even number. The output unit 240 synchronizes the first to the fourth pre driving signals PRE_2CLK to PRE_8CLK with the internal clock CLKP4 in order to output the first to the fourth driving signals 2CLK to 8CLK.

In detail, the delay unit 220 includes a signal input unit 222 for synchronizing the CAS signal CASP6 with the internal clock CLKP4 and a first flip-flop unit 224 having a plurality of flip-flops for synchronizing an output of the signal input unit 222 with the internal clock CLKP4 in order to output the first to the fourth pre driving signals PRE_2CLK to PRE_8CLK.

The output unit 240 includes a first to a fourth output units 242 to 248 for synchronizing the first to the fourth pre driving signals PRE_2CLK to PRE_8CLK with the internal clock in order to output the synchronized signals as the first to the fourth driving signals 2CLK to 8CLK respectively.

The first output unit 242 includes a delay element 242a for delaying the first pre driving signal PRE_2CLK; a NAND gate ND1 for receiving an output of the delay element 242a and the internal clock CLKP4; and a second inverter I3 for inverting an output of the NAND gate ND1 in order to generate the first driving signal 2CLK. Since a structure of the first output unit 242 is same to each structure of the second to the fourth output units 244 to 248, detailed descriptions for the second to the fourth output units 244 to 248 are omitted.

That is, the driving signal generation unit 200 synchronizes the CAS signal CASP6 with Nth clocks of the internal clock CLKP4 from an activation timing of the CAS signal CASP6 to thereby generate the first to the fourth pre driving signals PRE_2CLK to PRE_8CLK through the delay unit 220 and, then, synchronizes the first to the fourth pre driving signals PRE_2CLK to PRE_8CLK with the internal clock CLKP4 in order to output the first to the fourth driving signals 2CLK to 8CLK through the output unit 240.

Meanwhile, the number of the driving signals generated by the driving signal generation unit 200 is half of a maximum write latency supported by the semiconductor memory device.

Figure 9:
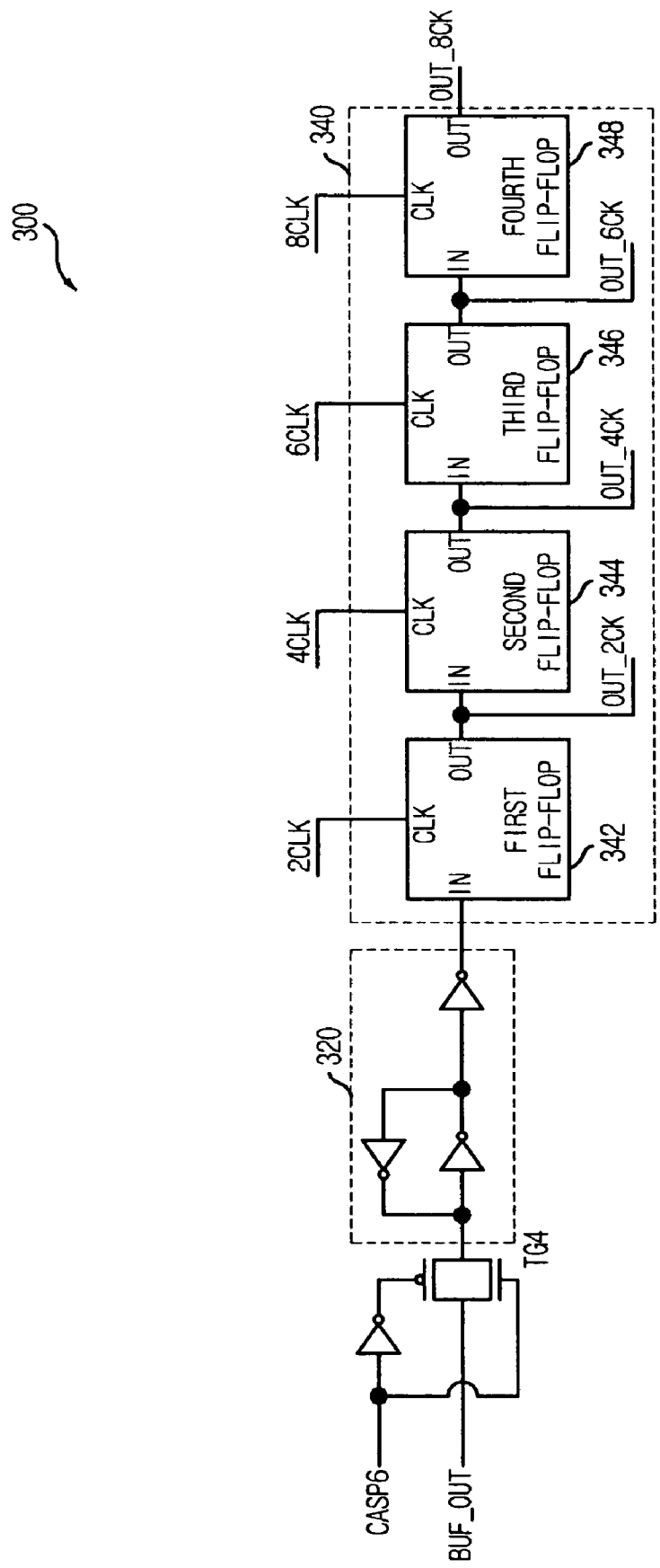
FIG. 9 is a schematic circuit diagram showing the address delay unit shown in FIG. 6.

FIG. 9 is a schematic circuit diagram showing the address delay unit 300 shown in FIG. 6.

As shown, the address delay unit includes a first transfer gate TG4 for transferring the internal address BUF_OUT in response to the CAS signal CASP6; a latch unit 320 for latching an output address of the first transfer gate TG4; and a second flip-flop unit 340 having a plurality of flip-flops for synchronizing an output of the latch unit 320 with the first to the fourth driving signals 2CLK to 8CLK to thereby output the first to the fourth delayed address OUT_2CK to OUT_8CK.

The second flip-flop unit 340 includes a first flip-flop 342 for outputting the output of the latch unit 320 as the first delayed address OUT_2CK in synchronization with the first driving signal 2CLK; a second flip-flop 344 for outputting the first delayed address OUT_2CK as the second delayed address OUT_4CK in synchronization with the second driving signal 4CLK; a third flip-flop 346 for outputting the second delayed address OUT_4CK as the third delayed address OUT_6CK in synchronization with the third driving signal 6CLK; and a fourth flip-flop 348 for outputting the third delayed address OUT_6CK as the fourth delayed address OUT_8CK in synchronization with the fourth driving signal 6CLK.

The address delay unit 300 outputs the internal address BUF_OUT as the first to the fourth delayed addresses OUT_2CK to OUT_8CK in synchronization with the first to the fourth driving signals 2CLK to 8CLK respectively. As above-mentioned, since the first to the fourth driving signals 2CLK to 8CLK have predetermined delay times from an activation timing of the CAS signal CASP6, the first to the fourth delayed address OUT_2CK to OUT_8CK are also outputted in synchronization with Nth clocks of the internal clock CLKP4 from the activation timing of the CAS signal CASP6.

Figure 10:
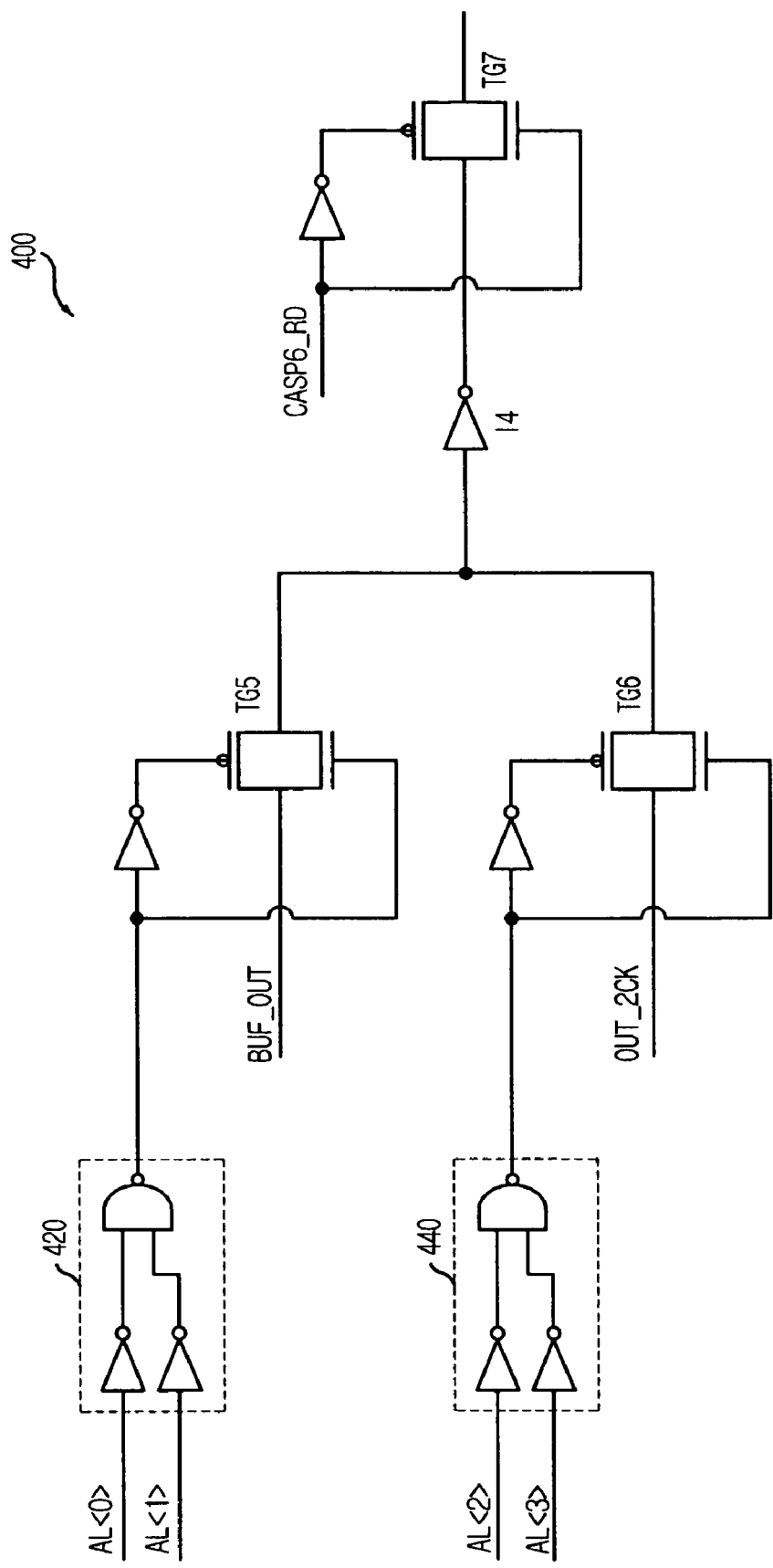
FIG. 10 is a schematic circuit diagram showing the RD selection unit shown in FIG. 6.

FIG. 10 is a schematic circuit diagram showing the RD selection unit 400 shown in FIG. 6.

As shown, the RD selection unit 400 includes a first signal input unit 420 for receiving AL information signals AL<0> and AL<1>; a second signal input unit 440 for receiving AL information signals AL<2> and AL<3>; a second transfer gate TG5 for transferring the internal address BUF_OUT to an output node in response to an output of the first signal input unit 420; a third transfer gate TG6 for transferring the first delayed address OUT_2CK to an output node in response to an output of the second signal input unit 440; a third inverter I4 for inverting a voltage loaded on a node commonly coupled by the output nodes of the second and the third transfer gates TG5 and TG6; and a fourth transfer gate TG7 for outputting an output of the third inverter I4 as the internal read address in response to the read CAS signal CASP6_RD.

The RD selection unit 400 selects one of the internal address BUF_OUT and the first delayed address OUT_2CK when one of the two continuous AL information signals (AL<0> and AL<1> or AL<2> and AL<3>) is inputted through the first signal input unit 420 or the second signal input unit 440 so that the selected address can be outputted as the internal read address.

That is, in case that the AL information signal AL<0> or the AL information signal AL<1> is activated, the output of the first signal input unit 420 is activated and, thus, the internal address BUF_OUT is selected by the second transfer gate TG5. However, since the selected address is outputted as the internal read address through the fourth transfer gate TG7 in synchronization with the read CAS signal CASP6_RD which has a different activation timing, an address corresponding to the additive latency is generated.

Meanwhile, since the first delayed address OUT_2CK which has various delay amounts by the address delay unit 300 has even numbers of delay amounts, both the two continuous AL information signals (AL<0> and AL<1> or AL<2> and AL<3>) are considered not selecting an address which corresponds to each additive latency according to each of the AL information signal AL<0:3>.

Figure 11:
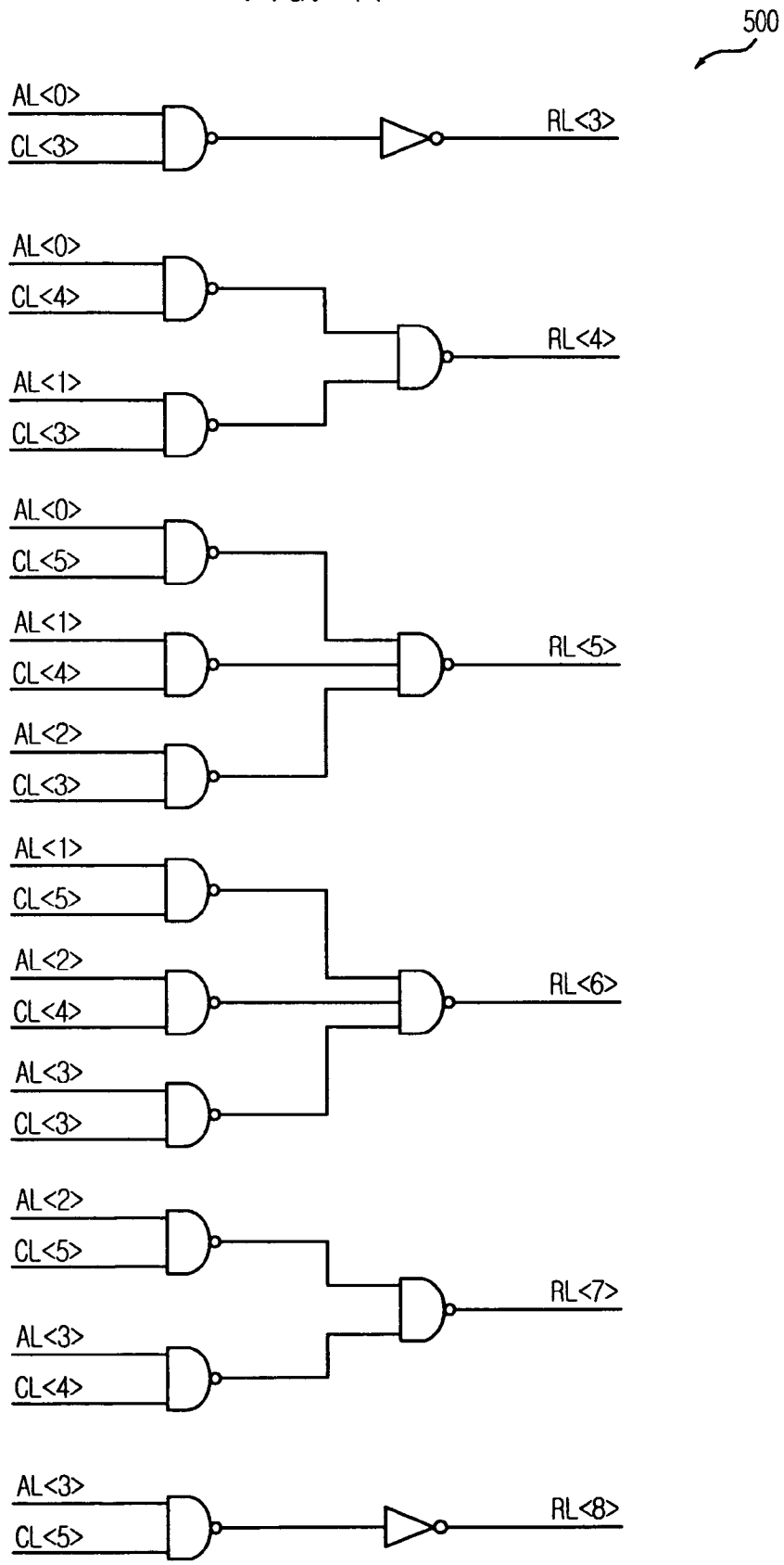
FIG. 11 is a schematic circuit diagram showing the read latency information signal generation unit shown in FIG. 6.

FIG. 11 is a schematic circuit diagram showing the read latency information signal generation unit 500 shown in FIG. 6.

As shown, the read latency information signal generation unit 500 performs a logic operation to each additive latency corresponding to the AL information signal AL<0:3> and each CAS latency corresponding to the CL information signal CL<3:5> in order to generate all possible cases of the read latency information signal RL<3:8>.

The read latency information signal generation unit 500 includes a plurality of logic OR gates for receiving the AL information signal AL<0:3> and the CL information signal CL<3:5>.

Figure 12:
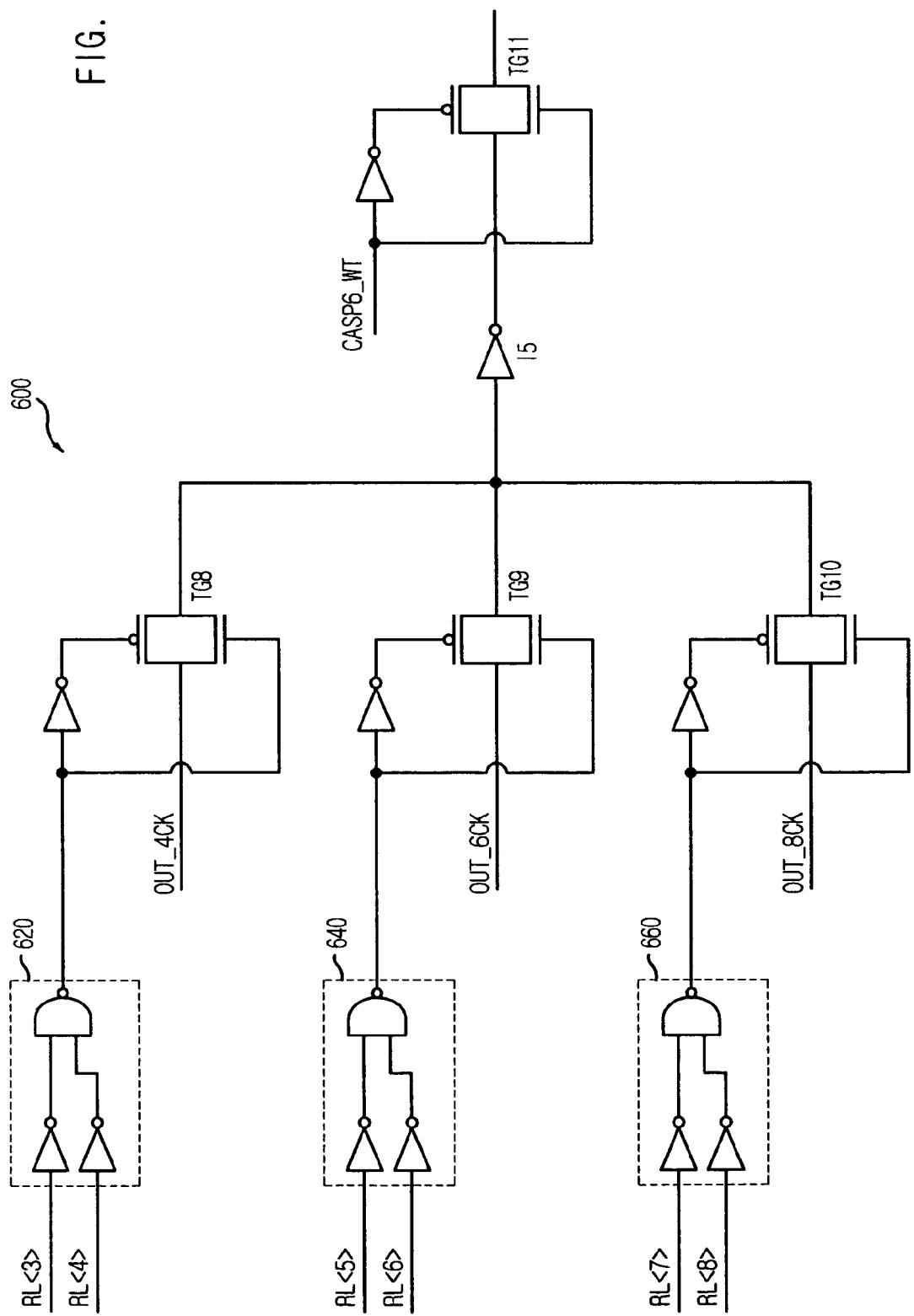
FIG. 12 is a schematic circuit diagram showing the WT selection unit shown in FIG. 6.

FIG. 12 is a schematic circuit diagram showing the WT selection unit 600 shown in FIG. 6.

As shown, the WT selection unit 600 includes a third signal input unit 620 for receiving the read latency information signals RL<3> and RL<4>; a fourth signal input unit 640 for receiving the read latency information signals RL<5> and RL<6>; a fifth signal input unit 660 for receiving the read latency information signals RL<7> and RL<8>; a fifth transfer gate TG8 for transferring the second delayed address OUT_4CK to an output node in response to an output of the third signal input unit 620; a sixth transfer gate TG9 for transferring the third delayed address OUT_6CK to an output node in response to an output of the fourth signal input unit 640; a seventh transfer gate TG10 for transferring the fourth delayed address OUT_8CK to an output node in response to an output of the fifth signal input unit 660; a fourth inverter I5 for inverting a voltage loaded on a node commonly coupled by the output nodes of the fifth to the seventh transfer gates TG8 to TG10; and an eighth transfer gate TG11 for outputting an output of the fourth inverter I4 as the internal write address in response to the write CAS signal CASP6_WT.

The WT selection unit 600 selects one of the second to the fourth delayed addresses OUT_4CK to OUT_8CK by the outputs of the third to the fifth signal inputs units 620 to 660 when one of the two continuous read latency information signals (RL<3> and RL<4> or RL<5> and RL<6> or RL<7>and RL<8>). Thereafter, the eighth transfer gate TG11 outputs the signal loaded on the commonly coupled node as the internal write address in response to the write CAS signal CASP6_WT.

Herein, the write CAS signal CASP6_WT is activated after a corresponding delay time of the write latency is passed from an activation timing of the CAS signal CASP6, particularly has a delay time of clocks of read latency+1.

Referring to FIGS. 6 to 12, an operation of the semiconductor memory device for generating the internal column address according to the read operation or the write operation is described below.

When the internal chip selection command CS4b, the internal RAS command RAS4 and the internal CAS command CAS4b for performing the read operation or the write operation are inputted, the command decoding unit 100 activates the CAS signal CASP6 in response to the inputted commands. Thereafter, the driving signal generation unit 200 generates the first to the fourth driving signals 2CLK to 8CLK synchronized with Nth activated clocks of the internal clock CLKP4 from the activation timing of the CAS signal CASP6, where N is an even number.

The address delay unit 300 generates the first to the fourth delayed addresses OUT_2CK to OUT_8CK synchronized with the first to the fourth driving signals 2CLK to 8CLK respectively. Herein, since the first to the fourth driving signals 2CLK to 8CLK are activated at Nth activated clocks of the internal clock CLKP4, the first to the delayed addresses OUT_2CK to OUT_8CK respectively have delay times of 2, 4, 6 and 8 clocks of the internal clock CLKP4 from the activation timing of the CAS signal CASP6.

The read latency information signal generation unit 500 generates the read latency information signal RL<3:8> corresponding to the write latency set in the semiconductor memory device by performing the logic operation to the AL information signal AL<0:3> and the CL information signal CL<3:5>.

Thereafter, the RD selection unit 400 selects an address corresponding to the AL information signal AL<0:3> in case of the read operation. Then, the selected address is outputted as the internal read address in synchronization with the read CAS signal CASP6_RD which is activated after a corresponding delay time of the additive latency is passed from the activation timing of the CAS signal CASP6.

In case of the write operation, the WT selection unit 600 selects an address corresponding to the read latency information signal RL<3:8>. Then, the selected address is outputted as the internal write address in synchronization with the write CAS signal CASP6_WT which is activated having a corresponding delay time of clocks of the read latency+1.

Thereafter, the latch unit 700 latches the internal read address or the internal write address to output the latched address as the internal column address AT_COL.

Figure 13:
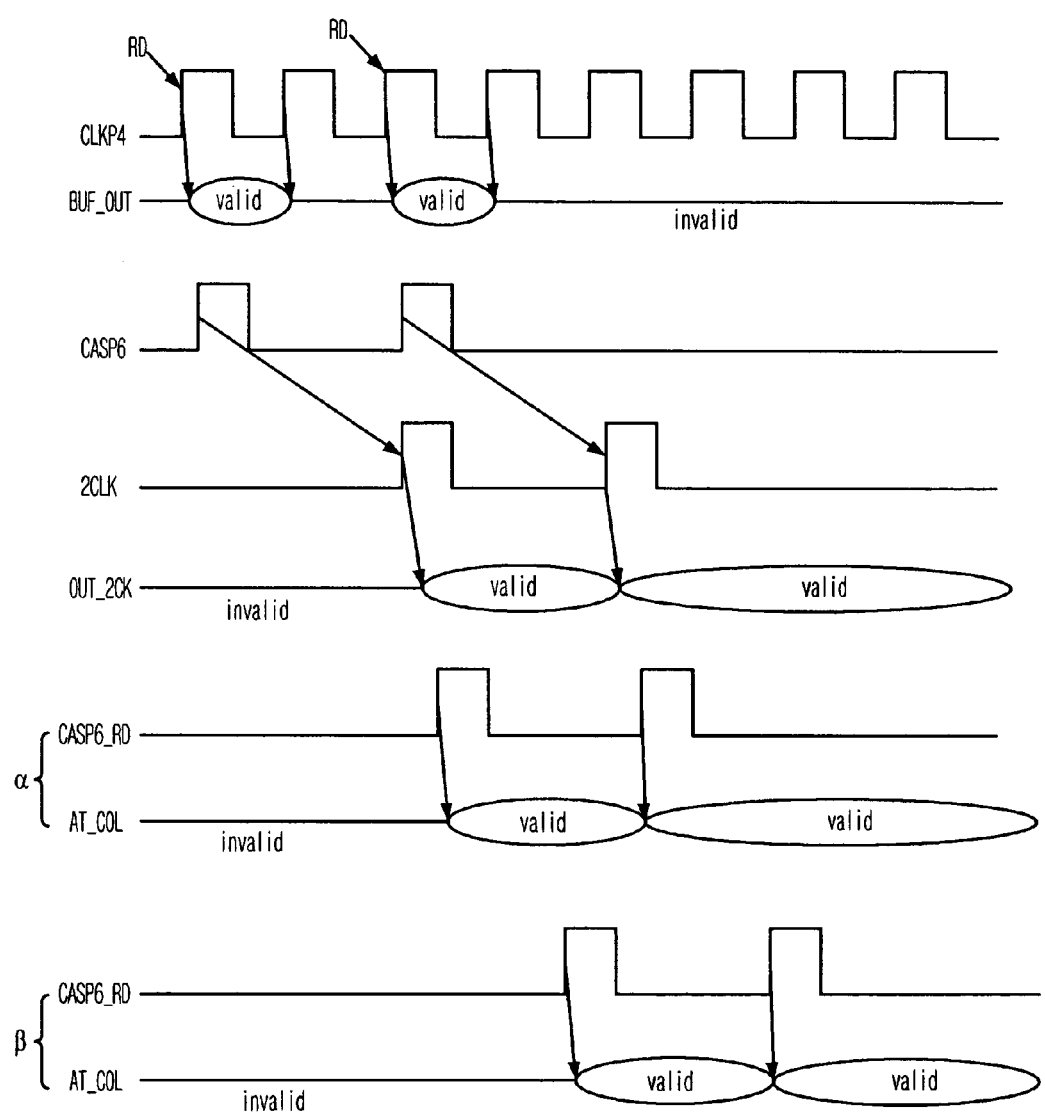
FIG. 13 is a timing diagram showing the operation of generating the internal column address in case of performing the read operation.

FIG. 13 is a timing diagram showing the operation of generating the internal column address in case of performing the read operation. Herein, it is assumed that the additive latency is 2 in the case 'α' and is 3 in the case 'β'.

As shown, if two read commands RD are inputted according to the external commands at intervals of 2 clocks, the CAS signal CASP6 is activated by the command decoding unit 100 in response to each read command RD.

Thereafter, the driving signal generation unit 200 generates the first to the fourth driving signals 2CLK to 8CLK synchronized with Nth activated clocks of the internal clock CLKP4 from the activation timing of the CAS signal CASP6, where N is a even number. The address delay unit 300 generates the first to the fourth delayed addresses OUT_2CK to OUT_8CK synchronized with the first to the fourth driving signals 2CLK to 8CLK respectively. Herein, the first driving signal 2CLK and the first delayed address OUT_2CK which correspond to the additive latency of the read command RD are shown.

Thereafter, as shown in the case 'α', since the read CAS signal CASP6_RD is activated after 2 clocks from the each read command RD satisfying the additive latency (2 clocks), the RD selection unit 400 outputs the first delayed address OUT_2CK as the internal column address AT_COL.

Meanwhile, as shown in the case 'α', since the read CAS signal CASP6_RD is activated after 3 clocks from the each read command RD satisfying the additive latency (3 clocks), the RD selection unit 400 accordingly outputs the internal column address AT_COL.

Since the first to the fourth delayed addresses OUT_2CK to OUT_8CK generated by the address delay unit 300 are valid during 2 clocks of the internal clock CLKP4, the first delayed address OUT_2CK is outputted same when the additive latency is 2 or 3.

Therefore, since the flip-flops for delaying an address are operated only while the read operation or the write operation is performed, the unnecessary power consumption for generating the internal column address can be prevented. Further, since the flip-flops are operated only at Nth clocks of the internal clock, where N is an even integer number, the power consumption can be more reduced.

The present application contains subject matter related to Korean patent application No. 2005-0036579, filed in the Korean Patent Office on Apr. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a command decoding unit for decoding a plurality of commands;
   a driving signal generation unit for generating a plurality of driving signals synchronized with Nth clocks of an internal clock from an activation timing of a CAS signal generated by the command decoding unit, wherein N is an even integer number;
   an address delay unit for receiving an internal address in response to the CAS signal and for delaying the internal address signal by synchronizing the internal address with the plurality of driving signals; and
   a data access block for performing a data access in response to the delayed internal address.

2. The semiconductor memory device as recited in claim 1, wherein the data access block includes:
   an RD selection unit for selectively outputting one of the internal address and a delayed address of the address delay unit as an internal read address in response to an AL information signal and a read CAS signal;
   a read latency information signal generation unit for receiving the AL information signal and a CL information signal to generate a read latency information signal;
   a WT selection unit for selectively outputting one of a plurality of delayed addresses of the address delay unit as an internal write address in response to the read latency information signal and a write CAS signal; and
   a latch unit for outputting one of the internal read and write addresses as an internal column address.

3. The semiconductor memory device as recited in claim 2, wherein the driving signal generation unit includes:
   a delay unit for generating a first to a fourth pre driving signals by synchronizing the CAS signal with Nth clocks of the internal clock from the activation timing of the CAS signal; and
   an output unit for synchronizing the first to the fourth pre driving signals with Nth clocks of the internal clock in order to output a first to a driving signals.

4. The semiconductor memory device as recited in claim 3, wherein the delay unit includes:
   a signal input unit for synchronizing the CAS signal with the internal clock; and a flip-flop unit having a plurality of flip-flops for synchronizing an output of the signal input unit with the internal clock in order to generate the first to the fourth pre driving signals.

5. The semiconductor memory device as recited in claim 4, wherein the output unit includes a first to a fourth output units for synchronizing the first to the fourth pre driving signals with the internal clock in order to output the first to the fourth driving signals respectively.

6. The semiconductor memory device as recited in claim 5, wherein the first output unit includes:
a delay element for delaying the first pre driving signal;
a NAND gate for receiving an output of the delay element and the internal clock; and
a first inverter for inverting an output of the NAND gate in order to generate the first driving signal.

7. The semiconductor memory device as recited in claim 2, wherein the address delay unit includes:
a first transfer gate for transferring the internal address in response to the CAS signal;
a latch for latching an output address of the first transfer gate; and
a flip-flop unit having a plurality of flip-flops driven by the plurality of driving signals for outputting a first to a fourth delayed addresses by synchronizing an output of the latch with a corresponding driving signals.

8. The semiconductor memory device as recited in claim 7, wherein the flip-flop unit includes:
a first flip-flop for outputting the output of the latch as the first delayed address in synchronization with the first driving signal;
a second flip-flop for outputting the output of the first flip-flop as the second delayed address in synchronization with the second driving signal;
a third flip-flop for outputting the output of the second flip-flop as the third delayed address in synchronization with the third driving signal; and
a fourth flip-flop for outputting the output of the third flip-flop as the fourth delayed address in synchronization with the fourth driving signal.

9. The semiconductor memory device as recited in claim 8, wherein the RD selection unit includes:
a first signal input unit for receiving a first and a second AL information signals;
a second signal input unit for receiving a third and a fourth AL information signals;
a second transfer gate for transferring the internal address to a first output node in response to an output of the first signal input unit;
a third transfer gate for transferring the first delayed address to the first output node in response to an output of the second signal input unit;
a second inverter for inverting a voltage loaded on the first output node; and a fourth transfer gate for outputting an output of the second inverter as the internal read address in response to the read CAS signal.

10. The semiconductor memory device as recited in claim 9, wherein the WT selection unit includes:
a third signal input unit for receiving a first and a second write latency information signals;
a fourth signal input unit for receiving a third and a fourth write latency information signals;
a fifth signal input unit for receiving a fifth and a sixth write latency information signals;
a fifth transfer gate for transferring the second delayed address to a second output node in response to an output of the third signal input unit;
a sixth transfer gate for transferring the third delayed address to the second output node in response to an output of the fourth signal input unit;
a seventh transfer gate for transferring the fourth delayed address to the second output node in response to an output of the fifth signal input unit;
a third inverter for inverting a voltage loaded on the second output node; and
an eighth transfer gate for outputting an output of the third inverter as the internal write address in response to the write CAS signal.

11. The semiconductor memory device as recited in claim 10, wherein the decoding unit includes:
a first PMOS transistor, wherein a gate of the first PMOS transistor receives an internal RAS command and a source of the first PMOS transistor is coupled to a first internal power supply voltage;
a first NMOS transistor, wherein a gate of the first NMOS transistor receives an internal CAS command and a drain of the first NMOS transistor is coupled to a drain of the first PMOS transistor;
a second NMOS transistor, wherein a gate of the second NMOS transistor receives the internal RAS command and a drain of the second NMOS transistor is coupled to a source of the first NMOS transistor;
a third NMOS transistor connected between a source of the second NMOS transistor and a second internal power supply voltage, wherein a gate of the third NMOS transistor receives an internal chip selection command;
a fourth inverter for inverting a voltage loaded on the commonly coupled node between the first PMOS transistor and the first NMOS transistor to generate the CAS signal; and
a second PMOS transistor connected between the first internal power supply voltage and the drain of the first PMOS transistor, wherein a gate of the second PMOS transistor receives the internal CAS command.

* * * * *